United States Patent
Cheng et al.

(10) Patent No.: US 12,116,665 B2
(45) Date of Patent: Oct. 15, 2024

(54) TRANSITION METAL CHALCOGENIDE THIN-LAYER MATERIAL, PREPARATION METHOD AND APPLICATION THEREOF

(71) Applicant: TSINGHUA-BERKELEY SHENZHEN INSTITUTE IN PREPARATION, Guangdong (CN)

(72) Inventors: Huiming Cheng, Guangdong (CN); Zhengyang Cai, Guangdong (CN); Yongjue Lai, Guangdong (CN); Bilu Liu, Guangdong (CN)

(73) Assignee: TSINGHUA-BERKELEY SHENZHEN INSTITUTE IN PREPARATION, Shenzhen (CN)

( * ) Notice: Subject to any disclaimer, the term of this patent is extended or adjusted under 35 U.S.C. 154(b) by 0 days.

(21) Appl. No.: 17/596,824

(22) PCT Filed: Jul. 19, 2019

(86) PCT No.: PCT/CN2019/096709
§ 371 (c)(1),
(2) Date: Dec. 17, 2021

(87) PCT Pub. No.: WO2020/252841
PCT Pub. Date: Dec. 24, 2020

(65) Prior Publication Data
US 2022/0316054 A1 Oct. 6, 2022

(30) Foreign Application Priority Data
Jun. 19, 2019 (CN) .......................... 201910529446.6

(51) Int. Cl.
*C23C 16/30* (2006.01)
*C23C 16/02* (2006.01)
*C23C 16/455* (2006.01)

(52) U.S. Cl.
CPC ........ *C23C 16/305* (2013.01); *C23C 16/0281* (2013.01); *C23C 16/45559* (2013.01)

(58) Field of Classification Search
None
See application file for complete search history.

(56) References Cited

U.S. PATENT DOCUMENTS

| 9,620,665 B1* | 4/2017 | Bartolucci ........ H01L 29/66969 |
| 2015/0118487 A1* | 4/2015 | Wolden ............... C03C 17/3464 |
| | | 204/192.15 |
| 2016/0379822 A1* | 12/2016 | Yang .................. H01L 21/3065 |
| | | 438/458 |

FOREIGN PATENT DOCUMENTS

| CN | 104233214 A | 12/2014 |
| CN | 204779804 U | 11/2015 |

(Continued)

OTHER PUBLICATIONS

Yang Lu et al. Self-Limiting Growth of High-Quality 2D Monolayer MoS 2 by Direct Sulfurization Using Precursor-Soluble Substrates for Advanced Field-Effect Transistors and Photodetectors. ACS Applied Nano Materials, vol. 2, No. 1, Jan. 25, 2019.*

(Continued)

*Primary Examiner* — David P Turocy
(74) *Attorney, Agent, or Firm* — MASCHOFF BRENNAN (57) ABSTRACT

Disclosed are a transition metal chalcogenide thin-layer material, a preparation method and an application thereof. The preparation method comprises: uniformly spreading a transition metal source between two substrates to prepare a sandwich structure; performing a heat treatment on the sandwich structure to fuse and bond the two substrates together, and performing a chemical vapor deposition reaction on a chalcogen element source and the fused and bonded sandwich structure under the protection of a protec- (Continued)

tive gas, wherein the transition metal source is heated to dissolve and diffuse at a reaction temperature, separated out from surfaces of the substrates, and reacts with the chalcogen element source. The prepared thin-layer material is uniformly distributed in a centimeter-level substrate.

5 Claims, 7 Drawing Sheets

(56) References Cited

FOREIGN PATENT DOCUMENTS

| CN | 108286042 A | | 7/2018 | |
|---|---|---|---|---|
| CN | 108408782 A | * | 8/2018 | ............. B82Y 40/00 |
| CN | 109023296 A | * | 12/2018 | ........... C23C 16/305 |
| CN | 109023298 A | | 12/2018 | |
| TW | 201808795 A | * | 3/2018 | ........... C01B 19/002 |

OTHER PUBLICATIONS

Lu, Yang et al. Self-Limiting Growth of High-Quality 2D Monolayer MoS2 by Direct Sulfurization Using Precursor-Soluble Substrates for Advanced Field-Effect Transistors and Photodetectors. ACS Appl. Nano Mater. 2019, 2, 1, 369-378.*

Lu et al. "Self-Limiting Growth of High-Quality 2D Monolayer MoS2 by Direct Sulfurization Using Precursor-Soluble Substrates for Advanced Field-Effect Transistors and Photodetectors" ACS Applied Nano Materials 2019 2 (1), 369-378 DOI: 10.1021/acsanm.8b01955.

International Search Report PCT/CN2019/096709 mailed Mar. 11, 2020.

Written Opinion PCT/CN2019/096709 mailed Mar. 11, 2020.

First Office Action in CN201910529446.6 mailed Feb. 3, 2020.

* cited by examiner

TRANSITION METAL CHALCOGENIDE THIN-LAYER MATERIAL, PREPARATION METHOD AND APPLICATION THEREOF

CROSS-REFERENCE TO RELATED APPLICATION

This application is a national phase entry under 35 USC § 371 of International Application PCT/CN2019/096709, filed Jul. 19, 2019, which claims the benefit of priority to Chinese Patent Application No. 201910529446.6, filed Jun. 19, 2019, the entire disclosure of which is incorporated herein by reference.

TECHNICAL FIELD

The disclosure relates to the technical field of two-dimensional semiconductor material preparation, in particular to a transition metal chalcogenide thin-layer material, a preparation method and an application thereof.

BACKGROUND

The progress of modern information technology largely depends on the development of integrated circuits based on semiconductor silicon. At present, due to the limitations of physical laws such as short channel effect and manufacturing cost, the mainstream Complementary Metal Oxide Semiconductor (CMOS) technology is about to reach the technical node of 10 nm, and is difficult to continue to improve, which also indicates that Moore's Law may face the end or delay. Therefore, exploring novel semiconductor materials and developing transistor technologies based on new principles to replace silicon-based CMOS technology is one of the mainstream research and development orientations of scientific and industrial circles in recent years.

With the upsurge of research on two-dimensional layered materials, transition metal chalcogenides, as a new type of two-dimensional layered compounds, which have unique crystal structures and energy band structures, have attracted extensive attention of researchers in many fields such as physics, chemistry, materials, sensing, electronics and optoelectronics. These materials have the following advantages: 1) there is no dangling bond on the surface of the material, and even at a very thin thickness (<1 nm), large scattering will not be caused to the carrier migration in Field Effect Transistors (FET), thus greatly reducing adverse effects of a surface state of the material on device performances; 2) these materials have ultra-thin thickness, and strong electrostatic regulation and control ability, can effectively switch "ON" and "OFF" states of the FET, and reduce the negative effects caused by the short channel effect; 3) these materials have a planar structure and have good compatibility with a device manufacturing process of a current silicon-based semiconductor technology; 4) these materials have good mechanical properties and are expected to meet the future requirements of flexible and wearable devices; and 5) these materials have rich material types and adjustable band gaps (between 0.9 eV and 2 eV), so that the prepared PET has a large switch ratio ($>10^4$ to $10^8$). Therefore, FET based on two-dimensional transition metal chalcogenides has attracted extensive attention of scholars and industry in recent years.

Typical transition metal chalcogenides include semiconductors (such as molybdenum disulfide, molybdenum diselenide, tungsten disulfide and tungsten diselenide) and metals (such as vanadium disulfide and vanadium diselenide). On this basis, doped transition metal chalcogenides (such as tungsten doped molybdenum disulfide and vanadium doped molybdenum disulfide) are expected to be widely used in micro-nano electronic devices, optical devices, spin devices, chemical and biological sensors, electrochemical catalysis and other fields due to their special optical, electrical and magnetic properties. At present, the growth of the transition metal chalcogenide (such as molybdenum disulfide) usually takes molybdenum trioxide and sulfur powder as reaction sources, and adopts the method of "downward-facing substrate" or "upward-facing substrate". However, the samples obtained by these methods are often not uniform, with thick samples in the middle region of the substrate and discrete triangular thin samples at the edges. Such uneven distribution may seriously affect the application of the transition metal chalcogenides in the electronic industry.

The existing patent application CN108286042A discloses a preparation method for a molybdenum disulfide thin film with uniform layers, that is, a large-area single-layer molybdenum disulfide thin film is prepared on a silicon substrate by potassium chloride assisted chemical vapor deposition, and single-layer molybdenum disulfide thin films with different sizes are obtained by controlling the amount of the potassium chloride. The layers of molybdenum disulfide grown by this method are uniform, but the distribution on the whole silicon substrate is difficult to achieve complete uniformity. The existing patent CN204779804U discloses a separate sulfur source temperature control system for improving a growth uniformity of molybdenum disulfide. A raw material bottle used in this system is filled with sulfur powder, a heat tracing belt is wound around the raw material bottle, and an argon input pipe and an argon output pipe are arranged in the raw material bottle, and the argon input pipe and the argon output pipe are communicated with an argon input pipe of a tube furnace. By adopting an independent temperature control technology of sulfur source, the temperature and vapor pressure of the sulfur source can be accurately controlled during the growth of the molybdenum disulfide film, thus avoiding early sulfurization of molybdenum trioxide caused by the early evaporation of sulfur in the traditional chemical vapor deposition process, and improving the uniformity of the molybdenum disulfide film. However, this method failed to improve the substrate, and only uniform samples could be prepared in a small area.

In conclusion, it is still necessary to explore new methods for preparing large-area uniform transition metal chalcogenide materials, so as to make the preparation process simple and controllable, improve the uniformity of samples, the repeatability of the methods and the reliability of device performances.

SUMMARY

In order to solve the foregoing technical problems, the present disclosure provides a transition metal chalcogenide thin-layer material, a preparation method and an application thereof.

A technical solution employed by the disclosure is as follows: a preparation method for a transition metal chalcogenide thin-layer material includes the following steps of:
  S1: uniformly spreading a transition metal source between two substrates to prepare a sandwich structure;
  S2: performing a heat treatment on the sandwich structure to fuse and bond the two substrates together; and
  S3: performing a chemical vapor deposition reaction on a chalcogen element source and the sandwich structure treated in step S2 under the protection of a protective gas; wherein the transition metal source is heated to dissolve and diffuse at a reaction temperature, separated out from surfaces of the substrates, and reacts with the chalcogen element source; and the chalcogen element source includes one or more of a sulfur source, a selenium source and a tellurium source.

The sulfur source may be selected from at least one of a solid-phase sulfur source, a liquid-phase sulfur source and a gas-phase sulfur source. Further, a combination of the solid-phase sulfur source and the liquid-phase sulfur source, a combination of the solid-phase sulfur source and the gas-phase sulfur source, or a combination of the solid-phase sulfur source, the liquid-phase sulfur source and the gas-phase sulfur source is adopted. The solid-phase sulfur source may specifically include sulfur powder and/or ammonium sulfide; the liquid-phase sulfur source includes ethylene glycol thioether or various mercaptans; and the gas-phase sulfur source may include hydrogen sulfide.

The transition metal source may be an organic or inorganic transition metal salt. The may be transition metal source is selected from one or more of a molybdenum source, a tungsten source, a vanadium source, a rhenium source, a tantalum source, a niobium source, a titanium source, a platinum source and a palladium source. Taking the molybdenum source as an example, one or more of molybdenum trioxide, ammonium molybdate, sodium molybdate, potassium molybdate, molybdenum pentachloride, molybdenum powder and molybdenum chlorideoxide may be specifically selected; and sodium molybdate may be used.

A mass ratio of the transition metal source to the chalcogen element source may be 1:(10 to 300). For example, the mass ratio of the transition metal source to the chalcogen element source may be 1:10, 1:30, 1:50, 1:100, 1:120, 1:150, 1:200, 1:210, 1:250 or 1:300, etc.

In the above manufacturing process, the transition metal source and the substrates are fused and bonded together by heat treatment at high temperature; the fused substrates react with the chalcogen element source by chemical vapor deposition under the protection of the protective gas. In this process, the transition metal source is heated to dissolve and diffuse at the reaction temperature, and then separated out from the surfaces of the substrates, and then reacts with the chalcogen. Therefore, the above fused substrate may be used as both the reaction source and the growth substrates simultaneously. The substrate is may include a glass substrate. The advantages of using the glass substrate are that during the growth process, the fused surface of the glass substrate is conducive to the diffusion of the transition metal source, reducing nucleation sites, and growing to obtain a larger transition metal chalcogenide thin-layer material, so that a large-area uniformly-distributed transition metal chalcogenide thin-layer material can be prepared.

A melting point of the glass substrate determines a viscosity of a fuse link, which further affects a diffusion rate of the transition metal source in the glass substrate and affects a kinetics process of the reaction. Therefore, a material of the glass substrate may include at least one of soda-lime glass, potassium glass, aluminum-magnesium glass, lead-potassium glass, borosilicate glass and quartz glass. For example, a combination of soda-lime glass and potassium glass, a combination of soda-lime glass and quartz glass, a combination of soda-lime glass, potassium glass and aluminum-magnesium glass, and a combination of lead-potassium glass, borosilicate glass and quartz glass may be used.

Usually, two substrates with the same size and area are selected. In order to facilitate the separation-out of the above transition metal sources from the surfaces of the substrates, a thickness of the upper substrate is generally smaller than that of a bottom substrate, so as to facilitate the diffusion and separation-out of the transition metal source from the surfaces of the upper substrates. In addition, the fusion and bonding between the substrates is a crucial step to determine the "dissolving-separating out" growth process, and the conditions of the fusion and bonding determine the distribution, diffusion mode, internal source concentration, surface flatness and other properties of the transition metal source. If the thickness of the upper substrate is too thin, the diffusion distance of the transition metal source is short and the diffusion is quick. In addition, a thicker transition metal source separating-out layer will be obtained on the surface. If the thickness of the upper substrate is too thick, the transition metal source will be difficult to diffuse out, and a thin transition metal source separating-out layer will be obtained on the surface. The two substrates may include the bottom substrate and the upper substrate, wherein the thickness of the bottom substrate ranges from 0.01 mm to 50.00 mm, and the thickness of the upper substrate ranges from 0.01 mm to 0.50 mm.

In addition, if a relative surface area ratio of the transition metal source to the surface of the substrate is too low, the grown thin-layer material can only be distributed in a certain area, rather than uniformly distributed on the whole substrate. If the relative surface area ratio of the transition metal source to the surface of the substrate is too high, the transition metal source will overflow from an edge of the substrate, so that a density of the grown material in the edge region is higher than that in the middle region. Therefore, the load amount of the transition metal source on the substrate may be 0.2 mg/cm$^2$ to 10 mg/cm$^2$, for example, 0.2 mg/cm$^2$, 0.5 mg/cm$^2$, 1 mg/cm$^2$, 2 mg/cm$^2$, 5 mg/cm$^2$ or 10 mg/cm$^2$, etc. Further, the areas of the two substrates are both 1 cm$^2$ to 100 cm$^2$.

In step S2, a temperature of the heat treatment may be 100° C. to 720° C. A time for heat treatment may be 1 minute to 300 minutes, and the time for heat treatment may be specifically controlled according to a thickness of the thin-layer material needed.

In step S3, the chemical vapor deposition reaction may be performed at 0.05 Torr to 1,000 Torr, 200° C. to 780° C., and under the protection of a protective gas.

The protective gas may be one or more of carbon dioxide, nitrogen, hydrogen or inert gas. The inert gas includes helium, neon, argon, krypton, xenon and radon. Helium and/or argon may be used.

The chalcogen element source may be at least one of a solid-phase chalcogen element source, a liquid-phase chalcogen element source and a gas-phase chalcogen element source.

If the chalcogen element source is a gas-phase chalcogen element source, the step S3 above may be performed in a tube furnace or box furnace, and the gas-phase chalcogen element source may be introduced into the tube furnace together with the protective gas.

If the chalcogen element source is a solid-phase chalcogen element source and/or a liquid-phase chalcogen element source, the step S3 above may be performed in a double-temperature zone tube furnace. The double-temperature zone tube furnace specifically includes a first heating zone and a second heating zone, and the two zones can meet the reaction requirements by controlling different heating temperatures. The first heating zone is mainly used for heating the solid-phase chalcogen element source and/or the liquid-phase chalcogen element source to volatilize and diffuse. The second heating zone is a main reaction zone, which is mainly used for realizing the chemical vapor deposition reaction. Specifically, the fused substrate containing the transition metal source separating-out layer may be placed in the second heating zone. The chalcogen element source volatilized from the first heating zone enters the second heating zone, and reacts with the transition metal source on the surface of the substrate under the protection of the protective gas to generate the transition metal chalcogenide. Because the transition metal source is uniformly diffused and separated out from the fused substrate, the grown transition metal chalcogenide has the characteristics of uniform distribution on the substrate. If the chalcogen element source is a solid-state chalcogen element source, a heating temperature of the first heating zone is generally 120° C. to 250° C. If the chalcogen element source is a liquid-state chalcogen element source, the heating temperature of the first heating zone is generally 40° C. to 100° C. A heating time of the first heating zone is generally 1 minute to 300 minutes. A reaction temperature of the second heating zone is generally 600° C. to 780° C., a reaction time of the second heating zone is 10 minutes to 60 minutes, and a heating rate of the second heating zone is 20° C./min to 50° C./min.

For example, the transition metal chalcogenide thin-layer material may be prepared by the following method which specifically includes the following steps of:

(1) uniformly spreading a transition metal source on a surface of a bottom glass substrate with a thickness of 1.0 mm to 50.0 mm, a load amount of the transition metal source being 0.2 mg/cm$^2$ to 10 mg/cm$^2$, and completely drying the bottom glass substrate in a blast drying oven, and then covering an upper glass substrate with the same size and a thickness of 0.1 mm to 0.5 mm; and performing heat treatment in a muffle furnace at 100° C. to 720° C. for 1 minute to 300 minutes at a heating rate of 20° C./min to 50° C./min to fuse and bond the two glass substrates after the heat treatment;

(2) using the glass substrates bonded in step (1) as the substrate and the transition metal source at the same time, placing the glass substrates in a second heating zone of a tube furnace, and placing a chalcogen element source and/or liquid-state chalcogen element source in a first heating zone upstream the tube furnace, a mass ratio of the chalcogen element source to the transition metal source being (10 to 300):1; and (3) introducing a protective gas into the tube furnace in step (2) at a rate of 5 to 200 mL/min, and making a pressure in the tube furnace be 0.05 Torr to 1,000 Torr by a mechanical pump; keeping a heating temperature of the first heating zone at 120° C. to 250° C.; and heating the second heating zone to 200° C. to 780° C. at a heating rate of 20° C./min to 50° C./min, wherein the transition metal source in the bonded glass substrates is heated to dissolve and diffuse at the reaction temperature, and is separated out on the surfaces of the glass substrates, reacted with the chalcogen element source volatilized from the first heating zone and entered the second heating zone for 10 minutes to 60 minutes at the reaction temperature, and then cooled naturally after the reaction to obtain a uniformly-distributed transition metal chalcogenide thin-layer material on the surfaces of the substrates.

The disclosure further provides a transition metal chalcogenide thin-layer material prepared by any of the above preparation methods for the transition metal chalcogenide thin-layer material. A general chemical composition formula of the transition metal chalcogenide thin-layer material is $M_aX_b$, wherein 'a' is 1, 2 or 3, and 'b' is 1, 2, 3 or 5; M represents transition metal elements such as molybdenum, tungsten, niobium, tantalum, vanadium, rhenium, platinum, palladium, titanium, or the like; and X represents chalcogen, such as sulfur, selenium, tellurium, or the like. According to the selected transition metal source and chalcogen element source, the corresponding transition metal chalcogenide thin-layer materials are prepared, such as molybdenum disulfide, tungsten disulfide, vanadium disulfide, rhenium disulfide, molybdenum diselenide, tungsten diselenide, vanadium diselenide, rhenium diselenide, and alloys formed by these materials. Through the above preparation methods, a large-scale highly-uniform transition metal chalcogenide thin-layer material can be prepared, and a crystal domain size of the thin-layer material is 20 μm to 200 μm and a thickness of the thin-layer material is 0.7 nm to 20 nm. The transition metal chalcogenide thin-layer material above is applicable to an electronic device, an optical device, an optoelectronic device, a chemical and biological sensor or an electrochemical catalytic device.

The disclosure has the beneficial technical effects that: The present disclosure provides the transition metal chalcogenide thin-layer material, the preparation method and the application thereof. The preparation method for the transition metal chalcogenide thin-layer material includes the following steps: uniformly spreading the transition metal source between two substrates to prepare the sandwich structure to fuse and bond the sandwich structure together under the condition of high-temperature heat treatment, then carrying out the chemical vapor deposition reaction on the chalcogen element source and the fused and bonded sandwich structure under the protection of the protective gas, wherein the transition metal source is heated and dissolved at the reaction temperature, and diffused to the periphery and the surface layers of the substrates driven by a thermal field, and then separated out on the surfaces of the substrates, and reacted with the chalcogen element source, so that the uniformly distributed transition metal chalcogenide thin-layer material can be obtained. From the above, it can be seen that a "dissolving-separating out" principle is combined with the chemical vapor deposition reaction so as to prepare the transition metal chalcogenide thin-layer material, the preparation method is simple and easy, and the process is controllable. The obtained transition metal chalcogenide thin-layer material is uniformly distributed in a centimeter-level substrate, and has good morphology, excellent optical, electrical, and like performances, and wide application prospects.

BRIEF DESCRIPTION OF THE DRAWINGS

In order to more clearly explain the technical solutions in the examples of the present disclosure, the drawings in the description of the examples will be briefly explained below.

FIG. 2(a) shows that two glass substrates are fused and bonded together by heat treatment; FIG. 2(b) shows that the molybdenum source is heated and dissolved, and then diffused to the periphery and the surfaces of the substrates driven by a thermal field, and then separated out on the surfaces of the substrates; FIG. 2(c) shows that a chemical vapor deposition reaction is performed between the sulfur source and the molybdenum source separated out on the surfaces of the substrates for nucleation under the protection of the protective gas; FIG. 2(d) shows that after nucleation, the molybdenum source is further grown to obtain the large-area uniformly-distributed molybdenum disulfide thin-layer material;

FIG. 9 is an optical micrograph and a laser Raman spectrum of a tungsten disulfide thin-layer material prepared in Example 3, wherein FIG. 9(a) shows the optical micrograph and FIG. 9(b) shows the laser Raman spectrum;

FIG. 10 is an optical micrograph and a laser Raman spectrum of a molybdenum diselenium thin-layer material prepared in Example 4, wherein FIG. 10(a) shows the optical micrograph and FIG. 10(b) shows the laser Raman spectrum;

FIG. 11 is an optical micrograph and a laser Raman spectrum of a molybdenum tungsten disulfide ($Mo_xW_{1-x}S_2$) alloy prepared in Example 6, wherein FIG. 11(a) shows the optical micrograph and FIG. 11(b) shows the laser Raman spectrum;

DETAILED DESCRIPTION

The present disclosure will be further explained with reference to the specific examples below. It should be understood that these examples are only used to illustrate the present disclosure and are not used to limit the scope of the present disclosure. Moreover, after reading the contents taught in the present disclosure, those skilled in the art can make various changes or modifications to the present disclosure, and these equivalent forms also fall within the scope of the present disclosure as defined in the claims.

Example 1

Figure 1:
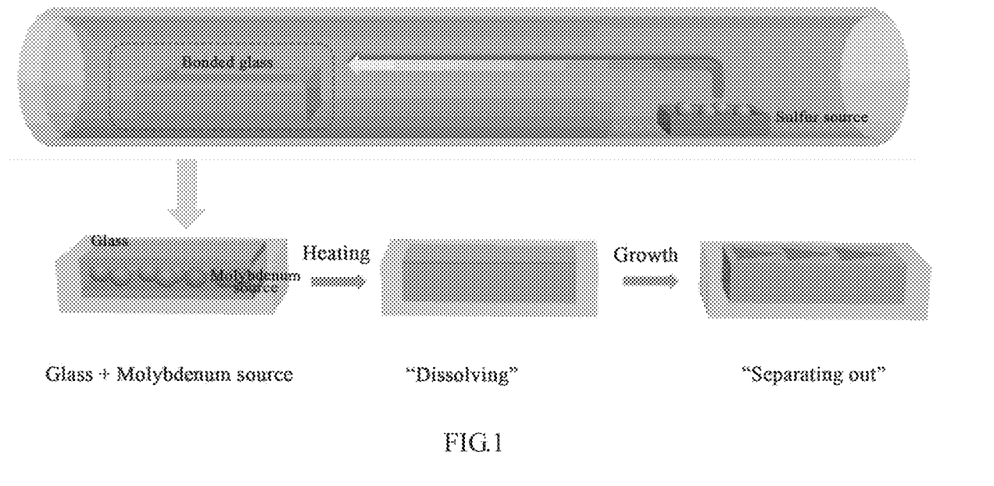
FIG. 1 is a schematic diagram of a preparation method for a large-area uniform molybdenum disulfide thin-layer material in Example 1 of the present disclosure.

This Example provided a large-area highly-uniform molybdenum disulfide thin-layer material and a preparation method therefor. A schematic diagram of the preparation method was as shown in FIG. 1, and the preparation method specifically included the following steps of:

(1) uniformly spreading 0.94 mg of sodium molybdate (molybdenum source) on a surface of a soda-lime glass substrate with length, width and thickness of 25 mm×10 mm×2 mm, and completely drying the soda-lime glass substrate in a blast drying oven, and then covering a soda-lime glass substrate with the same size and a thickness of 0.15 mm; and performing heat treatment in a muffle furnace at 700° C. for 30 minutes at a heating rate of 20° C./min; after the heat treatment, the two glass substrates being fused and bonded together;

(2) using the glass substrates bonded in step (1) as the substrate and the molybdenum source at the same time, placing the glass substrates in a second heating zone of a tube furnace, and placing sulfur powder (sulfur source) in a first heating zone upstream of the second heating zone in the tube furnace, a use amount of the sulfur powder being 200 mg; and (3) introducing argon into the tube furnace in step (2) at a rate of 50 mL/min, and making a pressure in the tube furnace be 1.2 Torr by a mechanical pump; keeping a heating temperature of the first heating zone at 220° C., and heating the second heating zone to 750° C. at a heating rate of 50° C./min, wherein the sodium molybdate in the bonded glass substrates was heated to dissolve and diffuse at the reaction temperature, and was separated out on the surfaces of the glass substrates, reacted with the sulfur source volatilized from the first heating zone and entered the second heating zone for 10 minutes at the reaction temperature, and then cooled naturally under the protection of 50 mL/min argon after the reaction to obtain a large-area highly-uniform molybdenum disulfide thin-layer material on the surfaces of the substrates.

Figure 2:
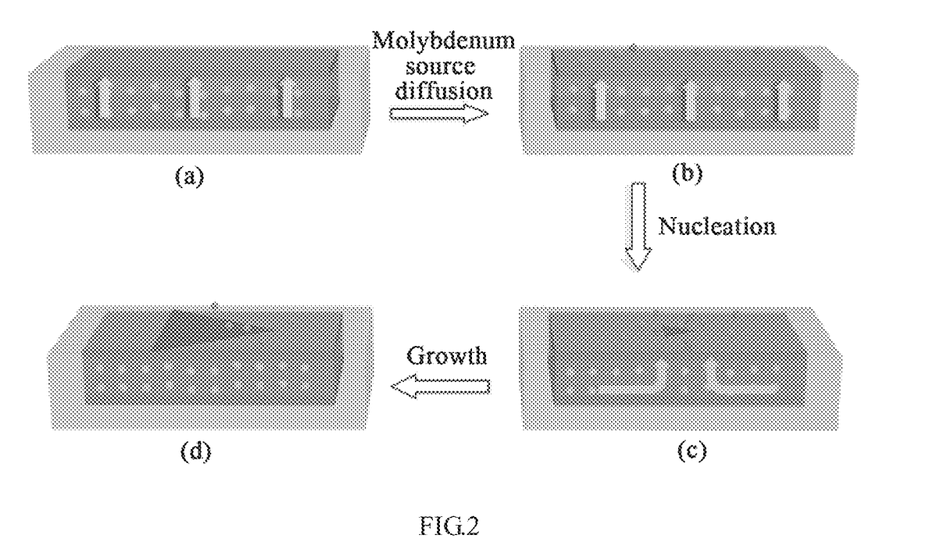
FIG. 2 is a schematic principle diagram of the preparation method for the large-area uniform molybdenum disulfide thin-layer material in Example 1 of the present disclosure.
Figure 3:
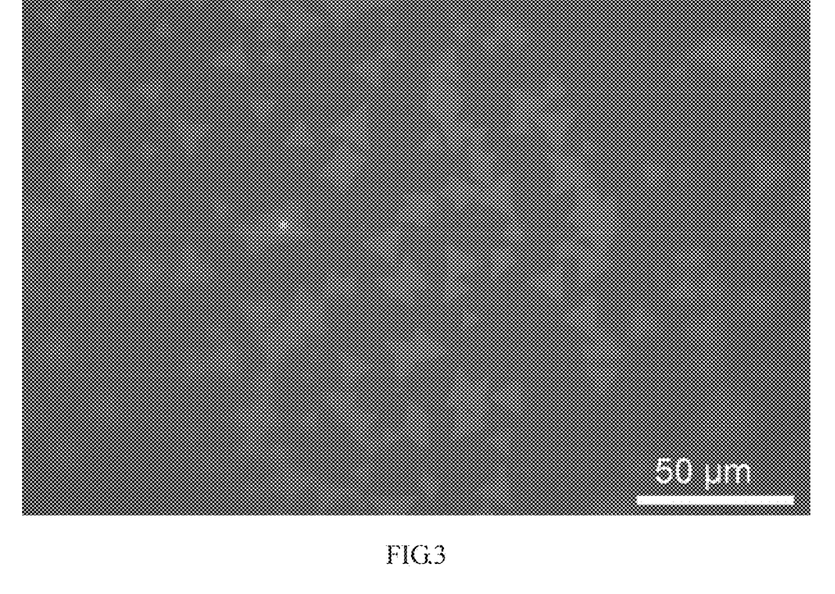
FIG. 3 is an optical micrograph of the large-area uniform molybdenum disulfide thin-layer material prepared in Example 1 of the present disclosure.
Figure 4:
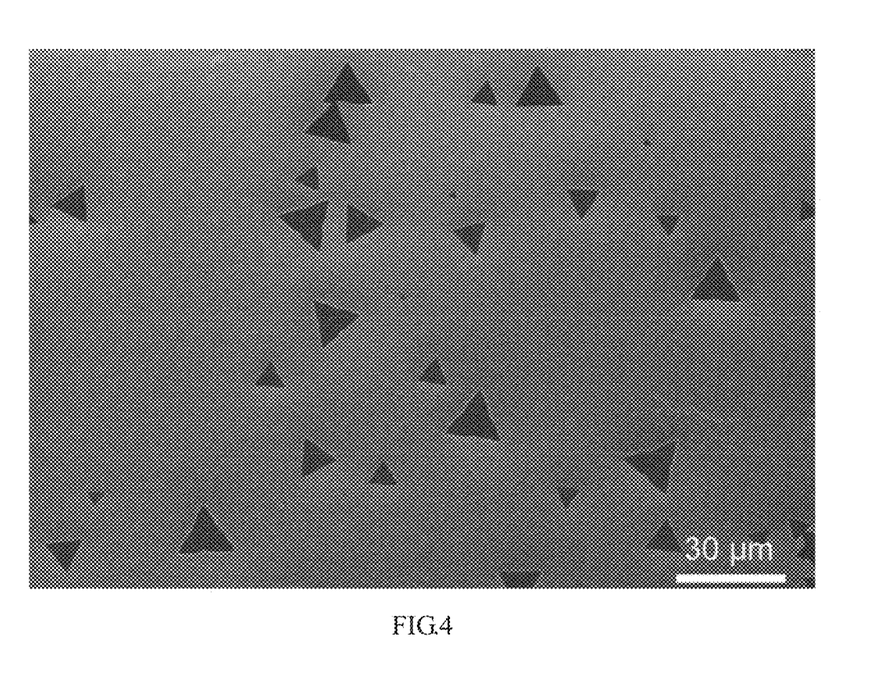
FIG. 4 is a scanning electron micrograph of the large-area uniform molybdenum disulfide thin-layer material prepared in Example 1 of the present disclosure.
Figure 5:
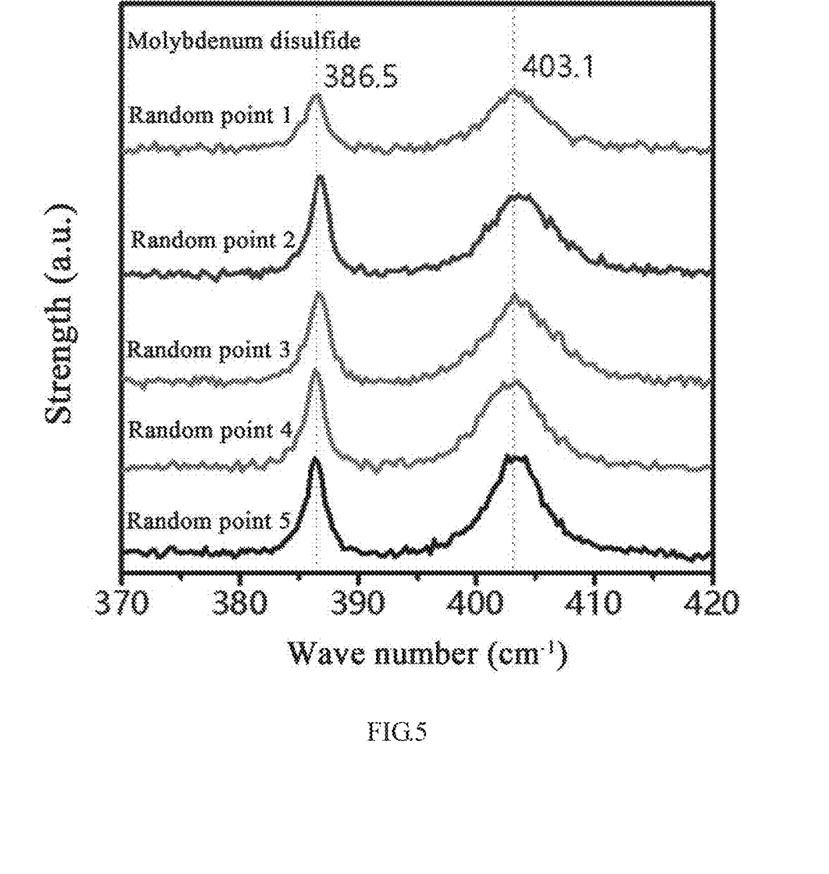
FIG. 5 is a laser Raman spectrum of the large-area uniform molybdenum disulfide thin-layer material prepared in Example 1 of the present disclosure.
Figure 6:
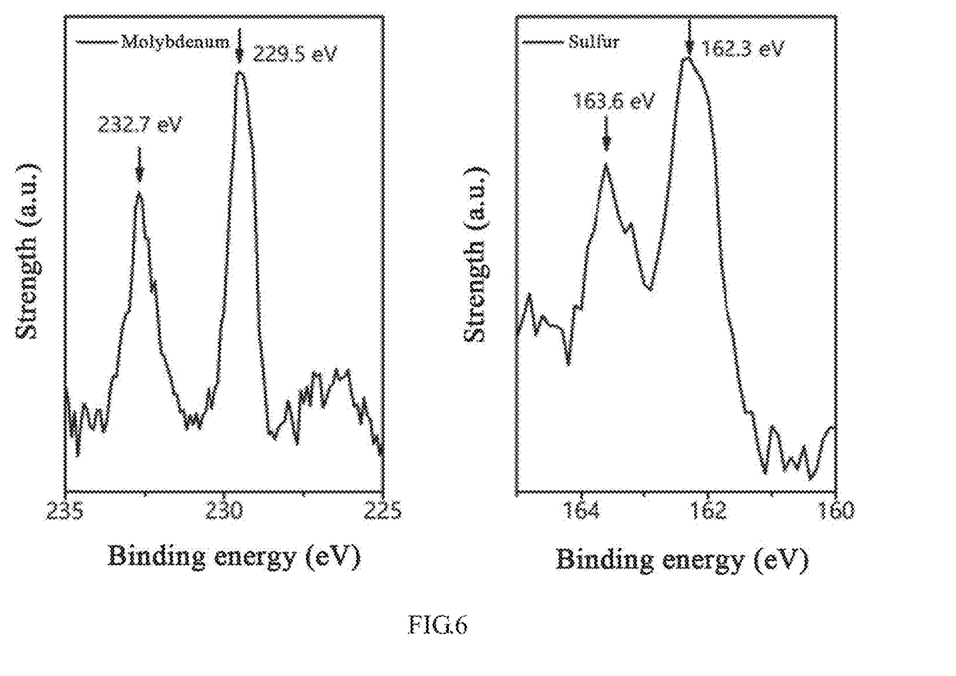
FIG. 6 is an X-ray photoelectron spectrum of the large-area uniform molybdenum disulfide thin-layer material prepared in Example 1 of the present disclosure.

A schematic principle diagram of the preparation method above was shown in FIG. 2. Firstly, as shown in FIG. 2(a), two glass substrates were fused and bonded together by heat treatment; As shown in FIG. 2(b), the molybdenum source was heated and dissolved, and then diffused to the periphery and the surfaces of the substrates driven by a thermal field, and then separated out on the surfaces of the substrates; As shown in FIG. 2(c), a chemical vapor deposition reaction was performed between the sulfur source and the molybdenum source separated out on the surfaces of the substrates for nucleation under the protection of the protective gas; As shown in FIG. 2(d), after nucleation, the molybdenum source was further grown to obtain the large-area uniformly-distributed molybdenum disulfide thin-layer material.

Figure 7:
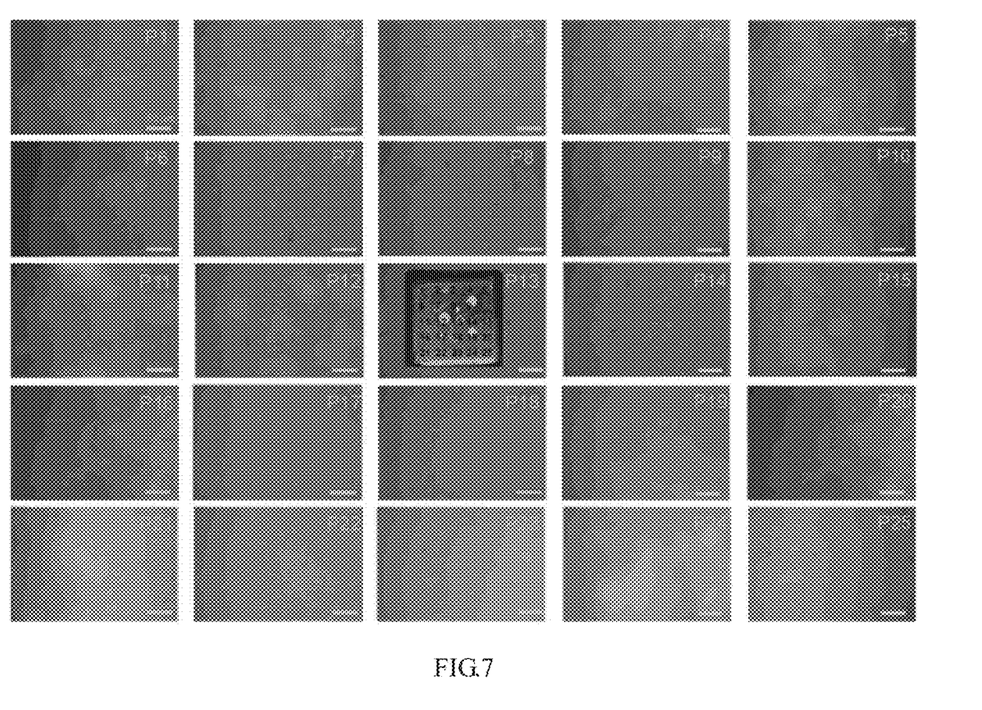
FIG. 7 is a uniform distribution diagram of the large-area uniform molybdenum disulfide thin-layer material prepared in Example 1 of the present disclosure on a 10 mm×10 mm glass substrate.
Figure 8:
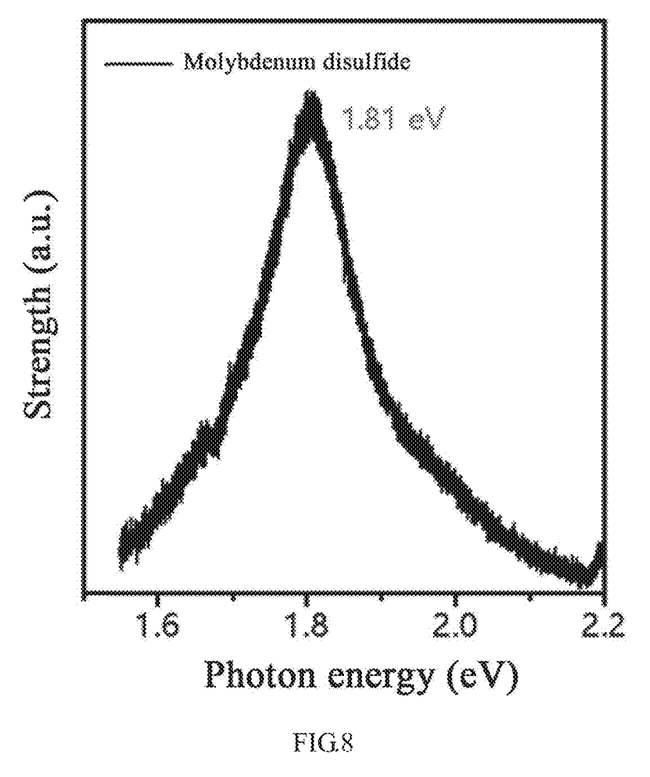
FIG. 8 is a photoluminescence diagram of the large-area uniform molybdenum disulfide thin-layer material prepared in Example 1 of the present disclosure.

The large-area uniform molybdenum disulfide thin-layer material prepared above was tested by optical microscope (OM), scanning electron microscope (SEM), Raman spectrometer (Raman) and X-ray photoelectron spectroscopy (XPS), and the results were respectively shown in FIG. 3, FIG. 4, FIG. 5 and FIG. 6 and an uniform distribution diagram and a photoluminescence diagram of the large-area uniform molybdenum disulfide thin-layer material on a 10 mm×10 mm glass substrate were shown in FIG. 7 and FIG. 8 respectively. From the results shown in FIGS. 3 to 8, it can be seen that in this Example, by adopting the "dissolving-separating out" chemical vapor deposition method, the large-area uniformly-distributed transition metal chalcogenide thin-layer material can be prepared, a distribution size of the obtained material was 20 μm to 200 μm and a thickness of the obtained material was only 0.7 nm to 20 nm.

Example 2

This Example provided a large-area highly-uniform molybdenum disulfide thin-layer material and a preparation method therefor. A schematic diagram of the preparation method included the following steps of:

(1) uniformly spreading 1.88 mg of sodium molybdate on a surface of a potassium glass substrate with length, width and thickness of 5 mm×10 mm×3 mm, and completely drying the potassium glass substrate in a blast drying oven, and then covering a soda-lime glass substrate with the same size and a thickness of 0.15 mm; and performing heat treatment in a muffle furnace at 720° C. for 30 minutes at a heating rate of 30° C./min; after the heat treatment, the two glass substrates being fused and bonded together;

(2) using the glass substrates bonded in step (1) as the substrate and the molybdenum source at the same time, placing the glass substrates in a second heating zone of a tube furnace, and placing sulfur powder (sulfur source) in a first heating zone upstream of the second heating zone in the tube furnace, a use amount of the sulfur powder being 300 mg;

(3) introducing argon into the tube furnace in step (2) at a rate of 80 mL/min, and making a pressure in the tube furnace be 1.7 Torr by a mechanical pump; keeping a heating temperature first heating zone at 180° C., and heating the second heating zone to 730° C. at a heating rate 50° C./min, wherein the sodium molybdate in the bonded glass substrates was heated to dissolve and diffuse at the reaction temperature, and was separated out on the surfaces of the glass substrates, reacted with the sulfur source volatilized from the first heating zone and entered the second heating zone for 30 minutes at the reaction temperature, and then cooled naturally after the reaction to obtain a large-area uniformly-distributed molybdenum disulfide thin-layer material on the surfaces of the substrates.

By using the same method as in Example 1, a distribution size of the molybdenum disulfide thin-layer material prepared in this Example was 20 μm to 200 μm, a thickness of the molybdenum disulfide thin-layer material was 1.4 nm to 2.8 nm, and the molybdenum disulfide thin-layer material was uniformly distributed on a surface of a 5 mm×10 mm large-area glass substrate.

Example 3

This Example provided a large-area highly-uniform tungsten disulfide thin-layer material and a preparation method therefor. A schematic diagram of the preparation method included the following steps of:

(1) uniformly spreading 0.94 mg of sodium wolframate (tungsten source) on a surface of a soda-lime glass substrate with length, width and thickness of 25 mm×10 mm×2 mm, and completely drying the soda-lime glass substrate in a blast drying oven, and then covering a soda-lime glass substrate with the same size and a thickness of 0.15 mm; and performing heat treatment in a muffle furnace at 680° C. for 30 minutes at a heating rate of 25° C./min; after the heat treatment, the two glass substrates being fused and bonded together;

(2) using the glass substrates bonded in step (1) as the substrate and the tungsten source at the same time, placing the glass substrates in a second heating zone of a tube furnace, and placing sulfur powder (sulfur source) in a first heating zone upstream of the second heating zone in the tube furnace, a use amount of the sulfur powder being 150 mg; and (3) introducing a protective gas into the tube furnace in step (2) at a rate of 80 mL/min, introducing hydrogen into the tube furnace at a rate of 4 mL/min, and making a pressure in the tube furnace be 5 Torr by a mechanical pump; keeping a heating temperature first heating zone at 190° C., and heating the second heating zone to 750° C. at a heating rate 50° C./min, wherein the sodium wolframate in the bonded glass substrates was heated to dissolve and diffuse at the reaction temperature, and was separated out on the surfaces of the glass substrates, reacted with the sulfur source volatilized from the first heating zone and entered the second heating zone for 15 minutes at the reaction temperature, and then cooled naturally after the reaction to obtain a large-area uniformly-distributed tungsten disulfide thin-layer material on the surfaces of the substrates.

Figure 9:
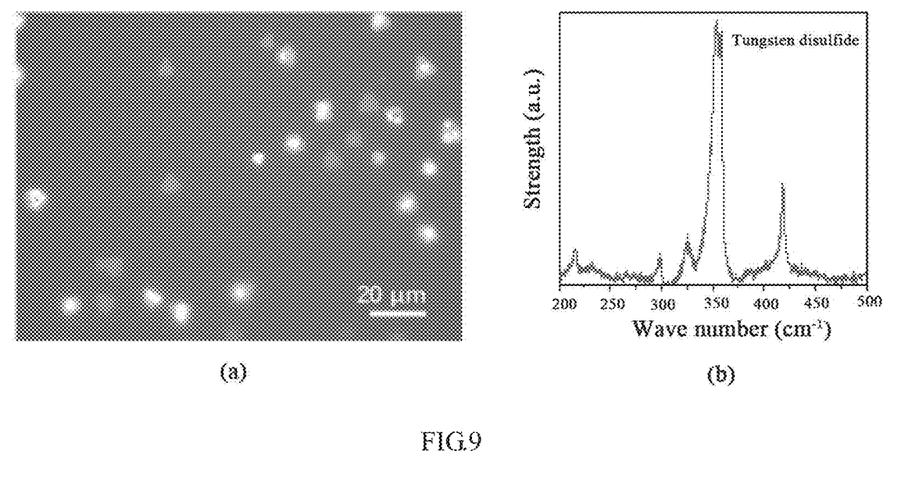

By using the same method as in Example 1, an optical micrograph and a laser Raman spectrum of the tungsten disulfide thin-layer material prepared in this Example were shown in FIG. 9, wherein FIG. 9(a) was the optical micrograph and FIG. 9(b) was the laser Raman spectrum; a distribution size of the tungsten disulfide thin-layer material was 20 μm to 200 μm, a thickness of the tungsten disulfide thin-layer material was 0.8 nm, and the tungsten disulfide thin-layer material was uniformly distributed on a surface of a 25 mm×10 mm large-area glass substrate.

Example 4

This Example provided a large-area highly-uniform molybdenum diselenium thin-layer material and a preparation method therefor. A schematic diagram of the preparation method included the following steps of:

(1) uniformly spreading 2.82 mg of sodium molybdate on a surface of a soda-lime glass substrate with length, width and thickness of 15 mm×15 mm×2 mm, and completely drying the soda-lime glass substrate in a blast drying oven, and then covering a soda-lime glass substrate with the same size and a thickness of 0.15 mm; and performing heat treatment in a muffle furnace at 650° C. for 60 minutes at a heating rate of 30° C./min; after the heat treatment, the two glass substrates being fused and bonded together;

(2) using the glass substrates bonded in step (1) as the substrate and the molybdenum source at the same time, placing the glass substrates in a second heating zone of a tube furnace, and placing selenium powder (selenium source) in a first heating zone upstream of the second heating zone in the tube furnace, a use amount of the selenium powder being 200 mg; and (3) introducing a protective gas into the tube furnace in step (2) at a rate of 80 mL/min, introducing hydrogen into the tube furnace at a rate of 8 mL/min, and making a pressure in the tube furnace be 2 Torr by a mechanical pump; keeping a heating temperature first heating zone at 280° C., and heating the second heating zone to 750° C. at a heating rate 50° C./min, wherein the sodium molybdate in the bonded glass substrates was heated to dissolve and diffuse at the reaction temperature, and was separated out on the surfaces of the glass substrates, reacted with the selenium source volatilized from the first heating zone and entered the second heating zone for 20 minutes at the reaction temperature, and then cooled naturally after the reaction to obtain a large-area uniformly-distributed molybdenum diselenium thin-layer material on the surfaces of the substrates.

Figure 10:
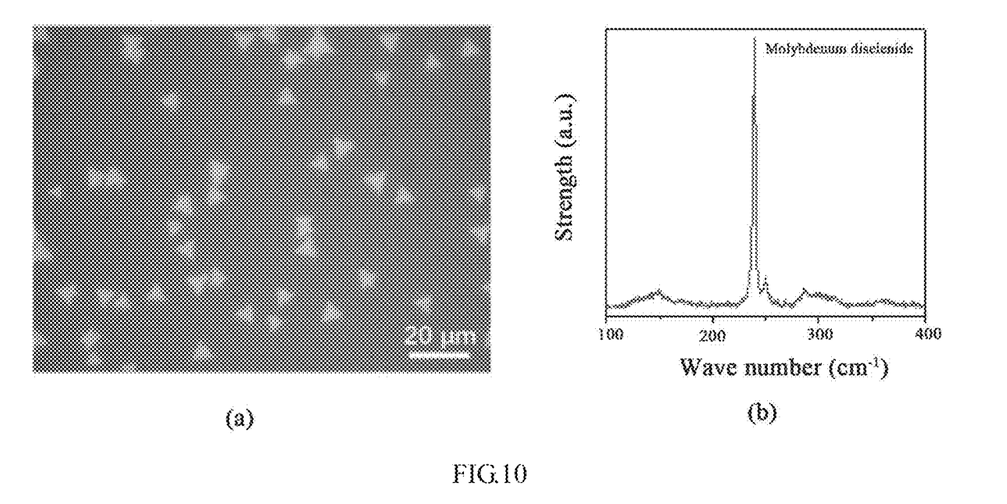

By using the same method as in Example 1, an optical micrograph and a laser Raman spectrum of the molybdenum diselenium thin-layer material prepared in this Example were shown in FIG. 10, wherein FIG. 10(a) was the optical micrograph and FIG. 10(b) was the laser Raman spectrum; a distribution size of the molybdenum diselenium thin-layer material was 20 μm to 200 μm, a thickness of the molybdenum diselenium thin-layer material was 1.4 nm to 3.0 nm, and the molybdenum diselenium thin-layer material was uniformly distributed on a surface of a 15 mm×15 mm large-area glass substrate.

Example 5

This Example provided a large-area highly-uniform rhenium doped molybdenum disulfide thin-layer material and a preparation method therefor. A schematic diagram of the preparation method included the following steps of:
(1) uniformly spreading 0.94 mg of sodium molybdate and 0.10 mg of sodium rhenate on a surface of a soda-lime glass substrate with length, width and thickness of 25 mm×15 mm×3 mm, and completely drying the soda-lime glass substrate in a blast drying oven, and then covering a soda-lime glass substrate with the same size and a thickness of 0.15 mm; and performing heat treatment in a muffle furnace at 700° C. for 30 minutes at a heating rate of 20° C./min; after the heat treatment, the two glass substrates being fused and bonded together;
(2) using the glass substrates bonded in step (1) as the substrate and the transition metal source at the same time, placing the glass substrates in a second heating zone of a tube furnace, and placing sulfur powder (sulfur source) in a first heating zone upstream of the second heating zone in the tube furnace, a use amount of the sulfur powder being 200 mg; and
(3) introducing argon into the tube furnace in step (2) at a rate of 50 mL/min, and making a pressure in the tube furnace be 1.2 Torr by a mechanical pump; keeping a heating temperature of the first heating zone at 220° C., and heating the second heating zone to 750° C. at a heating rate of 50° C./min, wherein the sodium molybdate and the sodium rhenate in the bonded glass substrates were heated to dissolve and diffuse at the reaction temperature, and were separated out on the surfaces of the glass substrates, reacted with the sulfur source volatilized from the first heating zone and entered the second heating zone for 10 minutes at the reaction temperature, and then cooled naturally after the reaction to obtain a large-area highly-uniform rhenium doped molybdenum disulfide single-layer material on the surfaces of the substrates.

By the same method as in Example 1, a distribution size of the rhenium doped molybdenum disulfide single-layer material prepared in this Example was 10 μm to 100 μm, a thickness of the rhenium doped molybdenum disulfide single-layer material was 0.7 nm to 0.8 nm, and the rhenium doped molybdenum disulfide single-layer material was uniformly distributed on a surface of a 25 mm×15 mm large-area glass substrate.

Example 6

This Example provided a large-area highly-uniform molybdenum tungsten disulfide ($Mo_xW_{1-x}S_2$) alloy thin-layer material and a preparation method therefor. A schematic diagram of the preparation method included the following steps of:
(1) uniformly spreading 0.24 mg of sodium molybdate and 3.6 mg of sodium wolframate on a surface of a soda-lime glass substrate with length, width and thickness of 25 mm×15 mm×3 mm, and completely drying the soda-lime glass substrate in a blast drying oven, and then covering a soda-lime glass substrate with the same size and a thickness of 0.15 mm; and performing heat treatment in a muffle furnace at 660° C. for 30 minutes at a heating rate of 20° C./min; after the heat treatment, the two glass substrates being fused and bonded together;
(2) using the glass substrates bonded in step (1) as the substrate and the transition metal source at the same time, placing the glass substrates in a second heating zone of a tube furnace, and placing sulfur powder (sulfur source) in a first heating zone upstream of the second heating zone in the tube furnace, a use amount of the sulfur powder being 150 mg; and
(3) introducing argon into the tube furnace in step (2) at a rate of 50 mL/min, and making a pressure in the tube furnace be 1.2 Torr by a mechanical pump; keeping a heating temperature of the first heating zone at 150° C., and heating the second heating zone to 750° C. at a heating rate of 50° C./min, wherein the sodium molybdate and the sodium wolframate in the bonded glass substrates were heated to dissolve and diffuse at the reaction temperature, and were separated out on the surfaces of the glass substrates, reacted with the sulfur source volatilized from the first heating zone and entered the second heating zone for 10 minutes at the reaction temperature, and then cooled naturally after the reaction to obtain a large-area highly-uniform molybdenum tungsten disulfide ($Mo_xW_{1-x}S_2$) alloy single-layer material on the surfaces of the substrates.

Figure 11:
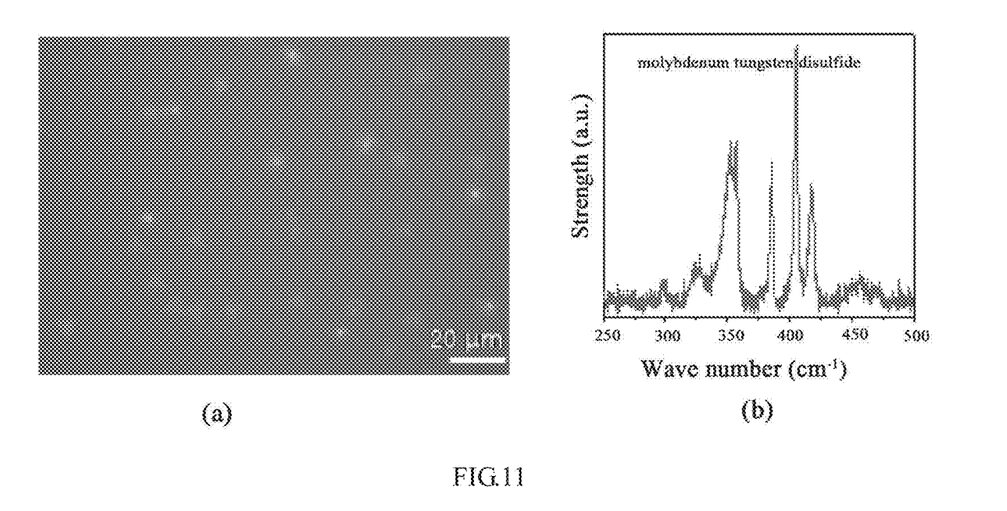

By using the same method as in Example 1, an optical micrograph and a laser Raman spectrum of the molybdenum tungsten disulfide ($Mo_xW_{1-x}S_2$) alloy single-layer material prepared in this Example were shown in FIG. 11, wherein FIG. 11(a) was the optical micrograph and FIG. 11(b) was the laser Raman spectrum; a distribution size of the molybdenum tungsten disulfide alloy single-layer material was 10 μm to 20 μm, a thickness of the molybdenum tungsten disulfide alloy single-layer material was 0.7 nm to 0.8 nm, and the molybdenum tungsten disulfide alloy single-layer material was uniformly distributed on a surface of a 25 mm×15 mm large-area glass substrate.

Comparative Example 1

(1) placing 10 mg of molybdenum trioxide and a $Si/SiO_2$ substrate in a second heating zone of a tube furnace, placing the $Si/SiO_2$ substrate face down directly above the molybdenum trioxide, and placing sulfur powder in a first heating zone upstream of the second heating zone in the tube furnace, a use amount of the sulfur powder being 600 mg; and
(2) introducing argon into the tube furnace in step (1) at a rate of 200 mL/min, keeping a heating temperature of the first heating zone at 250° C., and heating the second heating zone to 700° C. at a heating rate of 20° C./min, keeping the temperature for 10 minutes, and naturally cooling after the reaction to obtain a molybdenum disulfide thin-layer material.

Figure 12:
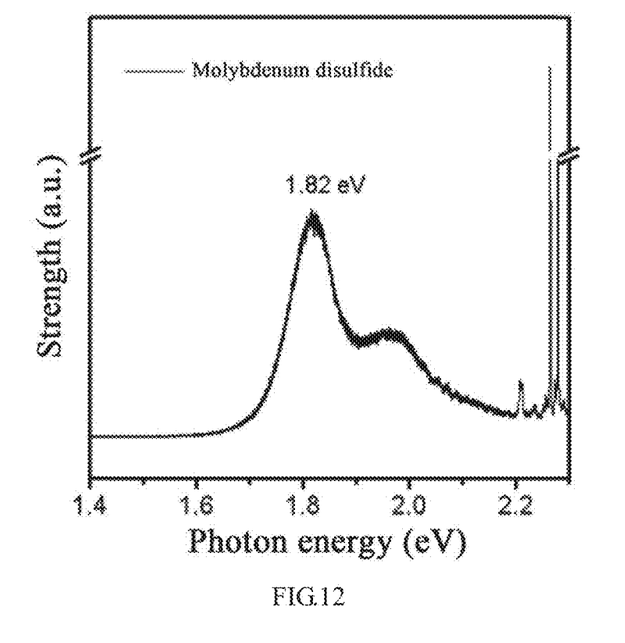
FIG. 12 is a photoluminescence diagram of a molybdenum disulfide thin-layer material prepared in Comparative example 1.
Figure 13:
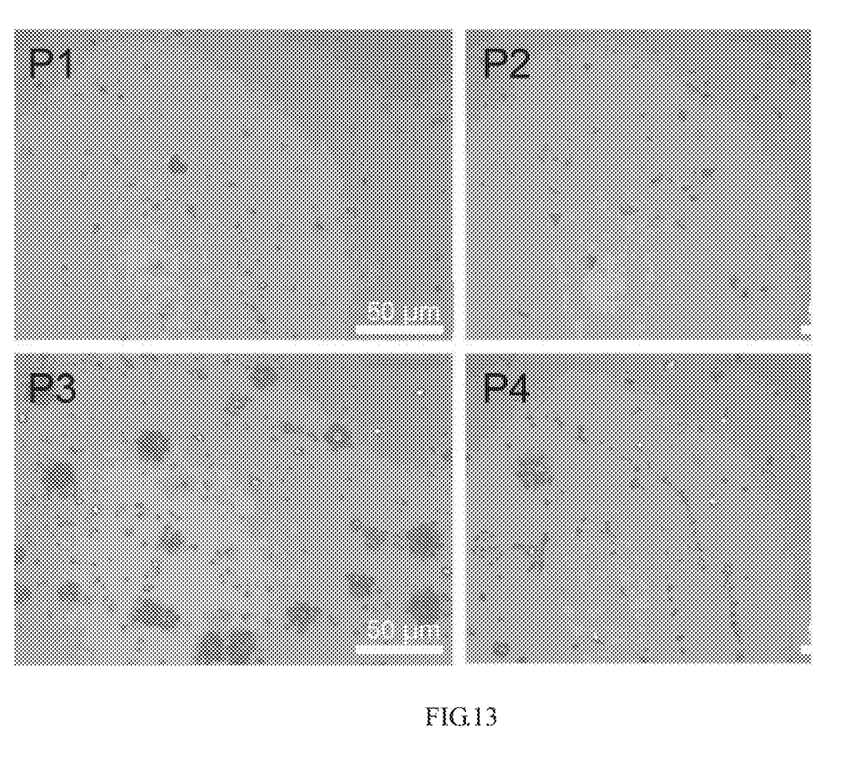
FIG. 13 is an optical micrograph of different positions P1 to P4 on the molybdenum disulfide thin-layer material prepared in Comparative example 1.

A photoluminescence diagram of the molybdenum disulfide thin-layer material prepared in Comparative example and optical micrographs of different positions P1 to P4 on the molybdenum disulfide thin-layer material were respectively tested. The obtained results were shown in FIG. 12 and FIG. 13. In FIG. 13, P1 to P4 respectively indicate that points were taken at different positions on the molybdenum disulfide thin-layer material prepared in Comparative example 1 for testing. From the results shown in FIG. 13, it can be seen that the morphologies of the samples observed at different positions were inconsistent, which indicated that the molybdenum disulfide thin-layer material prepared in Comparative example 1 was unevenly distributed.

From the above, it can be seen that the transition metal chalcogenide thin-layer material can be prepared through the present disclosure by adopting the "dissolving-separating out" chemical vapor deposition method, and meanwhile, the doping of transition metal sulfides can also be realized. The distribution size of the obtained material can be 20 μm to 200 μm, the thickness of the obtained material is only 0.7 nm to 20 nm, and the obtained material has excellent optical and electrical properties, and has wide application prospects in the fields of electronic devices, optical devices, sensors, electrochemical catalysis and the like.

Although the present disclosure has been specifically shown and described with reference to the Examples, it should be understood by those skilled in the art that various changes can be made in form and detail without departing from the spirit and scope of the present disclosure as defined in the claims, which are the protection scope of the present disclosure.

The invention claimed is:

1. A preparation method for a transition metal chalcogenide thin-layer material, comprising:
   S1: uniformly spreading a transition metal source between two glass substrates to prepare a sandwich structure consisting of a bottom substrate, the transition metal source, and an upper substrate, a thickness of the upper substrate is smaller than that of the bottom substrate, a thickness of the bottom substrate ranges from 1.00 mm to 50.00 mm, and a thickness of the upper substrate ranges from 0.01 mm to 0.50 mm; wherein areas of the two glass substrates are both 1 $cm^2$ to 100 $cm^2$, and a load amount of the transition metal source on the glass substrates is 0.2 $mg/cm^2$ to 10 $mg/cm^2$, wherein a material of the glass substrates includes at least one of soda-lime glass and lead potassium glass;
   S2: performing a heat treatment on the sandwich structure to fuse and bond the two glass substrates together, wherein a temperature of the heat treatment is 100° C. to 720° C.; and
   S3: performing a chemical vapor deposition reaction on a chalcogen element source and the sandwich structure treated in S2 under the protection of a protective gas; wherein the transition metal source in the bonded glass substrates is heated to dissolve and diffuse at a reaction temperature, separated out on the surfaces of the glass substrates, and reacts with the chalcogen element source; and the chalcogen element source comprises one or more of a sulfur source, a selenium source and a tellurium source.

2. The preparation method for the transition metal chalcogenide thin-layer material according to claim 1, wherein the transition metal source includes at least one of a molybdenum source, a tungsten source, a vanadium source, a rhenium source, a tantalum source, a niobium source, a titanium source, a platinum source and a palladium source.

3. The preparation method for the transition metal chalcogenide thin-layer material according to claim 1, wherein the sulfur source includes at least one of a solid-phase sulfur source, a liquid-phase sulfur source and a gas-phase sulfur source.

4. The preparation method for the transition metal chalcogenide thin-layer material according to claim 1, wherein a mass ratio of the transition metal source to the chalcogen element source is 1:(10 to 300).

5. The preparation method for the transition metal chalcogenide thin-layer material according to claim 1, wherein in S3, the chemical vapor deposition reaction is performed at 0.05 Torr to 1,000 Torr, 200° C. to 780° C., and under the protection of a protective gas; and the protective gas is one or more of nitrogen, helium, neon, argon, krypton, xenon, radon, hydrogen and carbon dioxide.

* * * * *